United States Patent [19]

Brandli et al.

[11] Patent Number: 5,227,012
[45] Date of Patent: Jul. 13, 1993

[54] METHOD OF MANUFACTURING MULTI-LAYER THIN FILM CIRCUITS CONTAINING INTEGRATED THIN FILM RESISTORS

[75] Inventors: Gerold Brandli, Aarau; Guido Bachmann, Sempach, both of Switzerland

[73] Assignee: Hightec MG AG, Lenzburg, Switzerland

[21] Appl. No.: 684,816

[22] Filed: Apr. 15, 1991

[30] Foreign Application Priority Data

Apr. 24, 1990 [CH] Switzerland ............... 01378/90

[51] Int. Cl.$^5$ .................. B44C 1/22; B29C 37/00; C23F 1/00
[52] U.S. Cl. ..................... 156/643; 156/655; 156/656; 156/659.1; 156/661.1; 156/652; 156/668; 156/901; 29/620; 428/209; 428/901
[58] Field of Search .............. 156/630, 633, 634, 643, 156/655, 656, 659.1, 661.1, 652, 668, 901, 902; 427/101, 102, 103, 272; 428/209, 901, 601; 308/308, 314; 29/610.1, 620

[56] References Cited

U.S. PATENT DOCUMENTS

| | | | |
|---|---|---|---|
| 3,726,733 | 4/1973 | Nakamura et al. | 156/662 |
| 4,496,435 | 1/1985 | Harada et al. | 204/15 |
| 4,752,555 | 6/1988 | Takada et al. | 427/103 X |

FOREIGN PATENT DOCUMENTS 0286854 10/1988 European Pat. Off. .
2079345 11/1971 France .
1339071 11/1973 United Kingdom .

*Primary Examiner*—William A. Powell
*Attorney, Agent, or Firm*—Sandler Greenblum & Bernstein

[57] ABSTRACT

In multi-layer thin film circuits, fabricated by alternate formation of conductor layers and insulating layers, there can be integrated thin film resistors which bear directly upon the substrate but nonetheless are not subjected, during manufacture, to the high temperatures of curing of the insulating layers and which then would be damaged. The manufacturing method also allows producing integrated electrical contacting between the thin film resistors and conductors of all of the conductor layers.

8 Claims, 1 Drawing Sheet

METHOD OF MANUFACTURING MULTI-LAYER THIN FILM CIRCUITS CONTAINING INTEGRATED THIN FILM RESISTORS

BACKGROUND OF THE INVENTION

1. Field of the Invention

The present invention broadly relates to the manufacture of printed circuit boards and, more specifically, relates to a new and improved method of manufacturing multi-layer thin film circuits containing integrated thin film resistors, wherein the superposed conductor layers are formed upon the substrate during successively performed method steps. In particular, the manufacturing method of the present invention can be used for producing double- or an even greater number of multi-layer thin film circuits containing integrated trimmable thin film resistors. The invention is also concerned with multi-layer thin film circuits produced in accordance with the inventive method.

2. Discussion of the Background and Material Information

Methods for the manufacture of multi-layer thin film circuits are known, for instance, from the European Patent Application No. 0,286,854, published Oct. 19, 1988, and entitled "Method of Manufacturing a Multi-Layer Thin Film Circuit". Knowledge of this prior art method is here assumed.

At the present time, multi-layer thin film circuits possess extremely high conductor track densities, and thus, short electrical connections. If, for instance, a circuit requires large supply currents which must be conducted through short wide conductors, and high conductor track densities, then there is advantageously used a multi-layer thin film circuit. If, however, there exists as an additional requirement, the need for precise trimmable resistors, then there must be employed a different or a hybrid technology, because thin film resistors can not be presently integrated in multi-layer thin film circuits for the following reasons:

(1) If the resistors are integrated in the lowermost layer of the thin film circuit which is situated closest to the heat-dissipating substrate, then there must be subsequently formed thereupon one or a number of insulating layers which are cured at temperatures which are too high for the resistor material; for instance, imidizing of polyimide layers at 300° C. to 400° C.

(2) If the resistors are integrated in the second or a further layer, then they are separated from the heat-dissipating substrate by at least one insulating layer, and thus, they can not be loaded to the same extent as would be possible if the heat were dissipated directly through the substrate.

Yet there are numerous fields of application where it would be advantageous to have such a combination of multi-layer thin film circuits containing thin film resistors. An example of such are high speed analog-to-digital converters. The analog part thereof requires precise trimmable resistors, the digital part thereof requires a high connection density and the high speed components collectively require large supply currents.

A manufacturing method would be advantageous where it would be possible to integrate thin film resistors in multi-layer thin film circuits in such a manner that they can be exposed to as high a current load as permitted by the resistor material with adequate heat dissipation. Moreover, it should be possible to directly mount the thin film resistors at the heat-dissipating substrate without having to expose the thin film resistors to a subsequent damaging method or manufacturing step.

SUMMARY OF THE INVENTION

Therefore, with the foregoing in mind, it is a primary object of the present invention to provide an improved method of manufacturing multi-layer thin film circuits containing integrated thin film resistors in a manner not afflicted with the aforementioned shortcomings and drawbacks of the prior art.

Another and more specific object of the present invention aims at the provision of an improved method of manufacturing thin film circuits with thin film resistors integrated thereat in such a manner that the thin film resistors can be exposed to as high a current load as permitted by the resistor material with adequate heat dissipation.

Still a further noteworthy object of the present invention and in keeping with the immediately preceding object is the provision of a multi-layer thin film circuit having thin film resistors directly mounted at the heat-dissipating substrate without having to expose the thin film resistors to a subsequent damaging manufacturing step.

Yet a further significant object of the present invention resides in the provision of multi-layer thin film circuits produced in accordance with the inventive method.

Now in order to implement these and still further objects of the present invention, which will become more readily apparent as the description proceeds, the manufacturing method of the present development is manifested, among other things, by the features that in all of the insulating layers and in all of the conductor layers, except the last produced conductor layer which is located furthest from the substrate, there are produced free zones in which, following all of the method steps for the thermal treatment of the insulating layers, there are produced thin film resistors such that the thin film resistors directly repose or bear at the substrate and can be subsequently processed.

The method of manufacturing multi-layer thin film circuits containing integrated thin film resistors, according to the invention, is predicated, among other things, upon the teaching that during the manufacture of the lower layers of the multi-layer thin film circuit and which are situated closest to the substrate, there are formed zones in which, only following completion of the damaging method or manufacturing steps, that is to say, only during the manufacture of the uppermost layer situated furthest or most remote from the substrate, are there produced thin film resistors. Within these zones the thin film resistors lie directly upon the substrate and, if necessary, can be subsequently trimmed.

Stated in another way, the manufacturing method of the present invention contemplates alternately forming conductor and insulating layers upon a substrate, forming free zones in all of the formed conductor and insulating layers, with the exception of the last conductor layer located furthest from the substrate, thermally treating each formed insulating layer, and upon completion of the thermal treatment of each formed insulating layer forming within the free zones thin film resistors which directly bear upon the substrate and which, if desired, can be subsequently processed, such as trimmed.

Furthermore, the formation of the last conductor layer situated furthest from the substrate contemplates forming an entire or complete surface adhesion film or layer from a material suitable for thin film resistors, forming an entire or complete surface conductor film or layer, applying to the conductor film or layer a photo-lacquer film or layer, patterning the applied photo-lacquer film or layer in correspondence with a desired conductor pattern of the last conductor layer, producing conductor tracks at the conductor film or layer, removing the applied photo-lacquer layer, etching away exposed portions of the conductor layer, applying a further photo-lacquer film or layer, patterning the applied further photo-lacquer film or layer in correspondence with a desired pattern of the thin film resistors and electrically contacting thereof with previously formed conductor layers, etching the adhesion film or layer, and removing the further applied photo-lacquer film or layer.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Describing now the drawings, it is to be understood that only enough of the details of the manufacturing steps or operations have been depicted therein, in order to simplify the illustration, as needed for those skilled in the art to readily understand the underlying principles and concepts of the method of manufacturing multi-layer thin film circuits with integrated thin film resistors according to the teachings of the present invention.

Figure 1A:
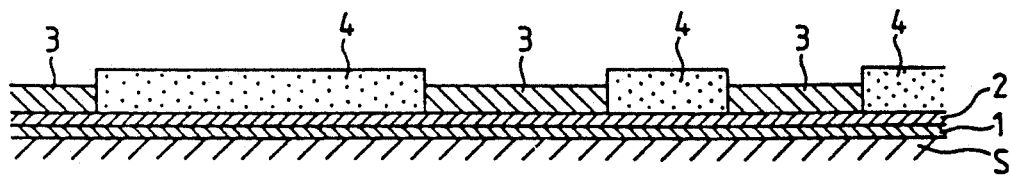
FIGS. 1a, 1b and 1c illustrate typical manufacturing steps carried out when performing the inventive method.
Figure 1B:
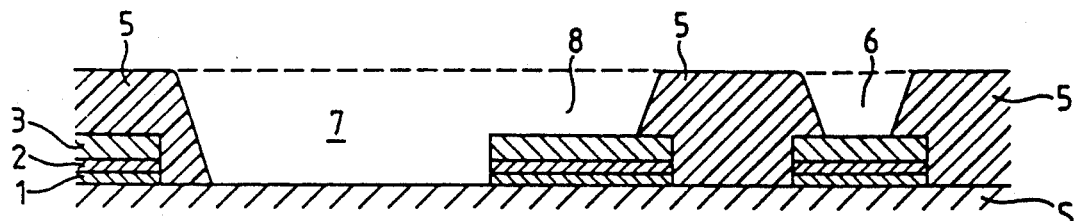
Figure 1C:
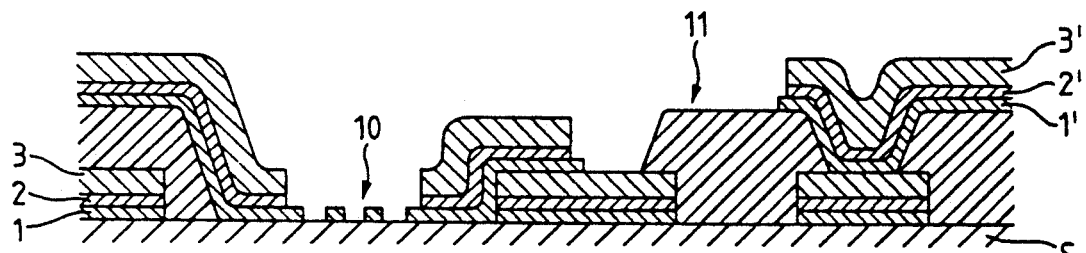

Turning attention first to FIGS. 1a, 1b and 1c, there are depicted therein the main steps of the inventive method in conjunction, by way of example, with a double-layer thin film circuit.

More specifically, in FIG. 1a there is applied, according to conventional techniques, a first conductor layer to a substrate S, here a ceramic substrate, for instance. By way of example, an adhesion film or layer 1 formed of an oxidation-prone metal, such as Cr, Ti, W, Al, NiCr, is sputtered on to the entire surface of the ceramic substrate S. A conductor film or layer 2, for instance, formed of Cu or Ni, is sputtered on to the entire surface of the adhesion film or layer 1. A film or layer of a suitable photo-lacquer 4 is applied over the conductor film 2 and is photolithographically patterned or structured to form the desired conductor pattern of the conductor film 2. Thereafter, there are selectively galvanically applied the conductor tracks 3, for instance formed of Cu or Au.

The photo-lacquer film or layer 4 is removed. The now exposed parts of the conductor film 2 are etched away with an etchant which is accommodated to the material of the conductor film 2. The thus exposed parts of the adhesion film 1 are then etched away with an etchant accommodated to the material of the adhesion film 1. The entire first conductor layer is now covered with an insulating layer or film 5, for instance, formed of negative photo-sensitive polyimide. By using a conventional technique accommodated to the material of the insulating layer 5, for instance, passing ultraviolet radiation through a photomask and subsequent development, there is appropriately patterned the insulating layer 5. Material of the insulating layer 5 is removed at all those locations where there should be produced through-contacts between the already produced and the superposed conductor layer (locations 6) and, further, according to the invention and as a new step, at those locations where there should be held open windows (zones) for thin film resistors (locations 7), and also at those locations where the thin film resistors to be produced are to be electrically contacted with the conductors of the lowermost layer (locations 8). Now, the insulating layer 5 is polymerized at a temperature suitable for this purpose.

It is here remarked, there can be used instead of photoactive polyimide, other materials for the insulating layer 5, such as dry etchable polyimide or benzocyclobutene, polyphenylquinoxaline or related materials. The insulating layer or film is initially polymerized, that is, cured at a temperature of up to 400° C., masked by a patterned etching resist according to a conventional technique, subsequently dry etched in plasma and then the mask is removed.

Continuing, a second conductor layer is applied in that, in a manner analogous to what has been described in surface an adhesion film or layer 1' formed from, for instance, NiCr or TaN, and a conductor film or layer 2'. Within the open windows produced in the first step, the adhesion film 1' bears directly upon the substrate S and at these locations forms the thin film resistors. Moreover, a photoresist film or layer (not shown) is applied, patterned in accordance with the desired conductor track pattern of this second conductor layer, the conductor tracks 3' are galvanically applied and the photoresist film or layer is removed. The conductor tracks of the second conductor layer contact the conductor tracks of the first conductor layer: at locations 6 where there are provided contact zones through the insulating layer 5, and at locations 8 where there are provided electrical contacting of the first (lower) conductor layer with the thin film resistors 10. After the formation of the conductor tracks 3' of the second conductor layer there is removed the photo-lacquer film or layer which was applied for this purpose and there are etched away the freely exposed parts of the conductor film or layer 2'. Before etching away the now freely exposed parts of the adhesion film or layer 1' (zones 7 and 11), there is again applied a photo-lacquer film or layer (not shown) in which there are applied the resistor patterns (zone 7). Advantageously, these are trimmable patterns which can be subsequently finely trimmed by laser trimming. The adhesion film 1' is then etched, resulting in the thin film resistors.

Typical thicknesses for the films or layers produced according to the invention are: 0.01 $\mu$m for the adhesion films or layers 1 and 1', 0.2 $\mu$m for the conductor films or layers 2 or 2', and 5 $\mu$m for the conductor tracks 3 or 3'.

The thin film resistor 10 shown in FIG. 1c is electrically connected at the left side of the illustration with a conductor of the second (upper) conductor layer, at the right side of the illustration with a conductor of the first (lower) conductor layer, between which conductors there can be adjusted the resistance. In analogous fashion there can be produced appropriate windows containing thin film resistors which are electrically contacted with other conductor layers, for example, at both sides with the second (upper) conductor layer. If desired, there can be finally applied over the entire structure a protective layer.

The same manufacturing method can be used in the described manner to fabricate more than two layer thin film circuits, and the thin film resistors are always formed by the uppermost conductor layer situated furthest from the substrate and which is last formed, but can be electrically contacted with conductors of any one of the conductor layers.

Figure 2:
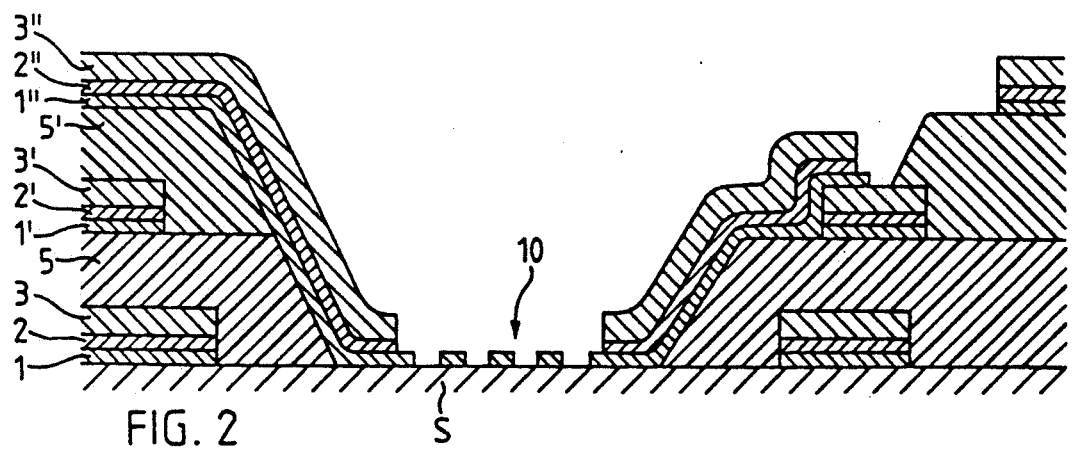
FIG. 2 illustrates an embodiment of a thin film resistor integrated in a three-layer thin film circuit and produced in accordance with the method of the present invention.

FIG. 2 illustrates a corresponding arrangement of a three layer thin film circuit. In this case, the thin film resistor 10 has been produced as part of the adhesion film or layer 1" of the third (uppermost) conductor layer, and the third conductor layer is produced in accordance with the manufacturing steps of the method described in conjunction with FIG. 1c. The depicted thin film resistor is electrically contacted at the left side of the illustration with the third (uppermost) conductor layer, and at the right side of the illustration with the second (intermediate) conductor layer. The window extends through both insulating layers 5 and 5'.

Also in the case of more than two layer thin film circuits there can be produced, by means of the inventive method, thin film resistors which are electrically contacted with any one of the conductor layers.

It is also possible to leave open windows like those for the thin film resistors in multi-layer thin film circuits and then to equip such with components which during operation generate a great deal of waste heat. Also such windows can be produced for bond wires and other electrical connections between components and conductors of the lower conductor layers.

While there are shown and described present preferred embodiments of the invention, it is distinctly to be understood the invention is not limited thereto, but may be otherwise variously embodied and practiced within the scope of the following claims.

What is claimed is:

1. A method of manufacturing multi-layer thin film circuits containing integrated thin film resistors, comprising the steps of:
   alternately forming conductor and insulating layers upon a substrate;
   forming free zones in all of the formed conductor and insulating layers, with the exception of the last conductor layer located furthest from the substrate;
   thermally treating each formed insulating layer; and
   upon completion of the thermal treatment of each formed insulating layer forming within the free zones thin film resistors which directly bear upon the substrate.

2. The method as defined in claim 1, wherein:
   formation of the last conductor layer located furthest from the substrate comprises the steps of:
   (a) forming an entire surface adhesion film from a material suitable for thin film resistors;
   (b) forming an entire surface conductor film;
   (c) applying to the conductor film a photo-lacquer film
   (d) patterning the applied photo-lacquer film in correspondence with a desired conductor pattern of the last conductor layer;
   (e) producing conductor tracks at the conductor film;
   (f) removing the applied photo-lacquer film;
   (g) etching away exposed portions of the conductor film;
   (h) applying a further photo-lacquer film;
   (i) patterning the applied further photo-lacquer film in correspondence with a desired pattern of the thin film resistors and electrically contacting thereof with previously formed conductor layers;
   (j) etching the adhesion film; and
   (k) removing the further applied photo-lacquer film.

3. The method as defined in claim 2, further including the steps of:
   patterning each formed insulating layer located between conductor layers and patterning the last conductor layer in order to produce integrated electrical connections between the thin film resistors and conductors of other conductor layers.

4. The method as defined in claim 1, further including the steps of:
   patterning each formed insulating layer located between conductor layers and patterning the last conductor layer in order to produce integrated electrical connections between the thin film resistors and conductors of other conductor layers.

5. The method as defined in claim 1, further including the step of:
   using photoactive polyimide for forming each insulating layer.

6. The method as defined in claim 1, further including the step of:
   using a material selected from dry etchable polyimide, benzocyclobutene and polyphenylquinoxaline for forming each insulating layer.

7. The method as defined in claim 1, further including the step of:
   providing the free zones, in addition to the thin film resistors, with further components which produce a great deal of waste heat.

8. A method of manufacturing multi-layer thin film circuits containing integrated thin film resistors, comprising the steps of:
   forming upon a substrate at least two conductor layers and at least one insulating layer located between the at least two conductor layers;
   the conductor layer located furthest from the substrate defining a last conductor layer;
   forming free zones in each of the formed conductor and insulating layers, with the exception of the last conductor layer located furthest from the substrate;
   thermally treating each formed insulating layer; and
   upon completion of the thermal treatment of each formed insulating layer forming within the free zones thin film resistor means which directly bear upon the substrate.

* * * * *